United States Patent
Lee et al.

(10) Patent No.: US 8,254,159 B2
(45) Date of Patent: Aug. 28, 2012

(54) METHOD OF DISCHARGING BIT-LINES FOR A NON-VOLATILE SEMICONDUCTOR MEMORY DEVICE PERFORMING A READ-WHILE-WRITE OPERATION

(75) Inventors: Yong-Jun Lee, Anyang-si (KR);
Byung-Gil Choi, Yongin-si (KR);
Du-Eung Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 184 days.

(21) Appl. No.: 12/662,512

(22) Filed: Apr. 21, 2010

(65) Prior Publication Data

US 2010/0329057 A1     Dec. 30, 2010

(30) Foreign Application Priority Data

Jun. 25, 2009    (KR) ................. 10-2009-0056769

(51) Int. Cl.
*G11C 11/00*     (2006.01)

(52) U.S. Cl. ................................... 365/148; 365/185.25

(58) Field of Classification Search .................. 365/148, 365/185.25
See application file for complete search history.

(56) References Cited

U.S. PATENT DOCUMENTS

| 7,139,185 | B2 * | 11/2006 | Kang ......................... 365/196 |
| 2004/0037114 | A1 | 2/2004 | Abedifard et al. |
| 2009/0285009 | A1 * | 11/2009 | Kim et al. .................... 365/148 |

FOREIGN PATENT DOCUMENTS

| JP | 10-064271 | 3/1998 |
| JP | 10-106269 | 4/1998 |

* cited by examiner

*Primary Examiner* — Huan Hoang
(74) *Attorney, Agent, or Firm* — Harness, Dickey & Pierce, P.L.C.

(57) ABSTRACT

In a method of discharging bit-lines for a non-volatile semiconductor memory device performing a read-while-write operation. The method include discharging a global write bit-line to a ground voltage based on a write command within a first period. The method also includes maintaining the discharged voltage of the global write bit-line in the ground voltage during a second period.

17 Claims, 5 Drawing Sheets

METHOD OF DISCHARGING BIT-LINES FOR A NON-VOLATILE SEMICONDUCTOR MEMORY DEVICE PERFORMING A READ-WHILE-WRITE OPERATION

CROSS-REFERENCE TO RELATED APPLICATION(S)

This application claims priority under 35 USC §119 to Korean Patent Application No. 2009-0056769, filed on Jun. 25, 2009, with the Korean Intellectual Property Office (KIPO), the entire contents of which are incorporated herein in its entirety by reference.

BACKGROUND

1. Field

Example embodiments relate to a non-volatile semiconductor memory device More particularly, embodiments relate to a method of discharging bit-lines for a non-volatile semiconductor memory device performing a read-while-write operation.

2. Description of the Related Art

If a speed of a write operation is slower than a speed of a read operation in a non-volatile semiconductor memory device, an ability of the non-volatile semiconductor memory device is reduced or limited due to a difference between the speed of the write operation and the speed of the read operation. As a result, a non-volatile semiconductor memory device performing a read-while-write operation may be used. The non-volatile semiconductor memory device may perform the read operation while performing the write operation in order to overcome, reduce or limit the difference between the speed of the write operation and the speed of the read operation.

Generally, the non-volatile semiconductor memory device performing the read-while-write operation may include a memory cell array having a plurality of memory cells. The semiconductor memory device may also include a plurality of local bit-lines coupled to the memory cells, a plurality of global write bit-lines for writing data into the memory cells, and a plurality of global read bit-lines for reading data from the memory cells. A global write bit-line and global read bit-line may be paired and/or coupled to a local bit-line through a local column selection unit.

Since a pair of the global write bit-line and the global read bit-line is coupled to the local bit-line during the read-while-write operation of the non-volatile semiconductor memory device, a coupling phenomenon between a discharge operation of the global write bit-line coupled to the local bit-line for the write operation may occur. Also, a develop operation of the global read bit-line coupled to the local bit-line for the read operation may occur if the non-volatile semiconductor memory device performs the read-while-write operation. As a result, the non-volatile semiconductor memory device may provide lower operation reliability and lower operation stability.

SUMMARY

Example embodiments provide a method of discharging bit-lines for a non-volatile semiconductor memory device performing a read-while-write operation. In example embodiments, a coupling phenomenon between a discharge operation of a global write bit-line for a write operation and a develop operation of a global read bit-line for a read operation may be reduced, limited or prevented if a non-volatile semiconductor memory device performs a read-while-write operation.

According to some example embodiments, the method includes discharging a voltage of a global write bit-line to a ground voltage based on a write command within a first period. The method may also include maintaining the discharged voltage of the global write bit-line in the ground voltage during a second period.

In some embodiments, both of the global write bit-line and the local bit-line may be maintained in a floating state before the write command is received into the non-volatile semiconductor memory device in a stand-by mode.

In some embodiments, the method may include discharging the local bit-line to a ground voltage based on an end timing point of the second.

In some embodiments, the local bit-line may be maintained in a floating state before discharging the local bit-line based on the end timing point of the second period.

In some embodiments, the method may include discharging the local bit-line to a ground voltage based on the write command before discharging the global write bit-line based on the write command within the first period.

In some embodiments, the local bit-line may be maintained in a floating state after discharging the local bit-line based on the write command before discharging the local bit-line based on the end timing point of the second period.

In some embodiments, the non-volatile semiconductor memory device may be a phase change random access memory (PRAM) device.

In some embodiments, the write command may correspond to one of a program command for a program operation and an erase command for an erase operation.

In some embodiments, the write command may include a plurality of command cycles that are performed in sequence.

In some embodiments, the program operation may be performed based on the command cycles in the program command.

In some embodiments, the erase operation may be performed based on the command cycles in the erase command.

In some embodiments, the first period may be defined by an end timing point of the write command to a start timing point of an initial read operation.

In some embodiments, the second period may be defined by an end timing point of a discharge operation of the global write bit-line to a start timing point of an initial write pulse.

In some embodiments, the first period may be defined by an end timing point of a certain command cycle in the write command to a start timing point of an initial read operation.

In some embodiments, the second period may defined by an end timing point of a discharge operation of the global write bit-line to a start timing point of an initial write pulse.

According to some example embodiments, in a method of discharging bit-lines for a non-volatile semiconductor memory device performing a read-while-write operation, a coupling phenomenon between a discharge operation of a global write bit-line for a write operation and a develop operation of a global read bit-line for a read operation may be limited, reduced or prevented if a non-volatile semiconductor memory device performs a read-while-write operation. As a result, the non-volatile semiconductor memory device can achieve higher operation reliability and higher operation stability.

BRIEF DESCRIPTION OF THE DRAWINGS

Illustrative, non-limiting example embodiments may be more clearly understood when the following detailed description is taken in conjunction with the accompanying drawings.

DETAILED DESCRIPTION OF THE EMBODIMENTS

Figure 1:
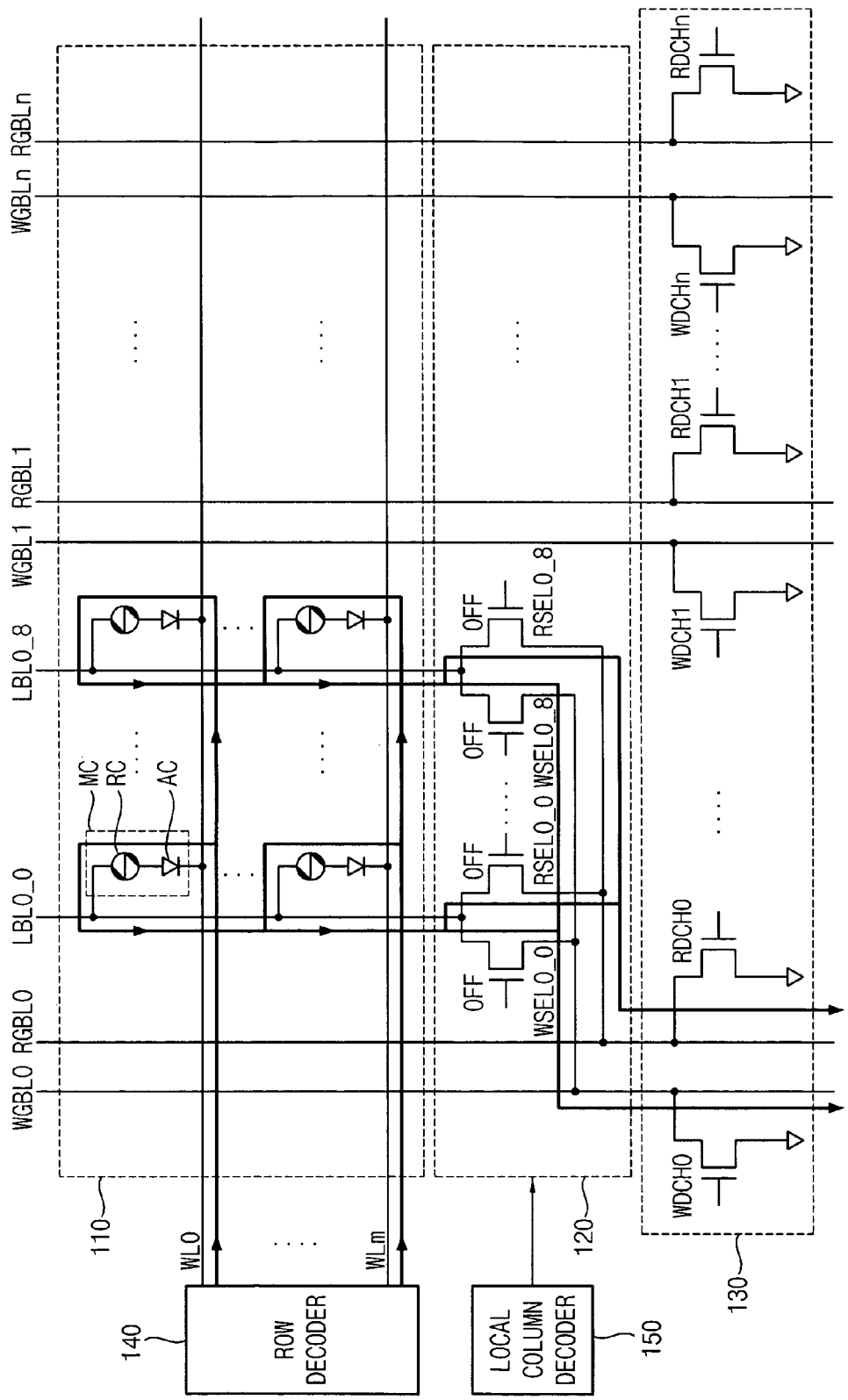
FIG. 1 is a block diagram illustrating a memory core of a non-volatile semiconductor memory device performing a read-while-write operation.

Example embodiments will be described more fully hereinafter with reference to the accompanying drawings However, it should be understood that the present inventive concepts may, be embodied in many different forms and should not be construed as limited to the example embodiments set forth herein. In the drawings, the sizes and relative sizes of layers and regions may have been exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory core of a non-volatile semiconductor memory device performing a read-while-write operation.

Referring to FIG. 1, the memory core 100 may include a memory cell array 110, a local column selection unit 120, a discharge unit 130, a row decoder 140, and a local column decoder 150.

The memory core 100 may be included in the non-volatile semiconductor memory device such as a phase change random access memory (PRAM) device, a resistive random access memory (RRAM) device, a magnetic random access memory (MRAM) device, a ferroelectric random access memory (FRAM) device, etc. Hereinafter, it is assumed that the non-volatile semiconductor memory device according to an example embodiment is the PRAM device. However, the non-volatile semiconductor memory device is not limited to the PRAM device or similar embodiments. The PRAM device includes a plurality of memory cells that are implemented by a phase change material. Generally, the phase change material may switch between two states (i.e., crystalline state and amorphous state) with the application of heat. Further, the phase change material in the crystalline state has low resistance and the phase change material in the amorphous state has high resistance. Thus, the PRAM device may perform memory operations based on these characteristics of the phase change material. For example, the characteristic of the phase change material in the crystalline state may also result in SET data. Additionally, the characteristic of the phase change material in the amorphous state may result in RESET data. As illustrated in FIG. 1, the PRAM device includes the memory core 100 having the memory cell array 110, the local column selection unit 120, the discharge unit 130, the row decoder 140, and the local column decoder 150.

The memory cell array 110 may include a plurality of phase change memory cells MC. The phase change memory cells MC may include a variable resistive element RC and an access element AC. The variable resistive element RC may be implemented by the phase change material. The access element AC may control a current flowing through the variable resistive element RC. Each of the phase change memory cells MC may be a transistor controlled PRAM cell that uses a transistor as the access element AC. Alternatively, the transistor controlled PRAM cell may use a diode controlled PRAM cell that uses a diode as the access element AC. Although the phase change memory cells MC in FIG. 1 are the diode controlled PRAM cells, the phase change memory cells MC are not limited to the diode controlled PRAM cells. The phase change memory cells MC may be coupled to local bit-lines LBL0 through LBLn. In an exemplary embodiment, the memory cell array 100 may include a plurality of banks having the phase change memory cells MC.

The local column selection unit 120 may include a plurality of write local column selection transistors WSEL0 through WSELn, and a plurality of read local column selection transistors RSEL0 through RSELn. The phase change memory cells MC in the memory cell array 110 may be coupled to the local bit-lines LBL0 through LBLn. The local bit-lines LBL0 through LBLn may be coupled to pairs of the global write bit-lines WGBL0 through WGBLn and the global read bit-lines RGBL0 through RGBLn by the local column selection unit 120. For example, the local bit-lines LBL0_0 through LBL0_8 may be coupled to a pair of the global write bit-line WGBL0 and the global read bit-line RGBL0 by each pair of the write local column selection transistors WSEL0_0 through WSEL0_8 and the read local column selection transistors RSEL0_0 through RSEL0_8 in the local column selection unit 120. As illustrated in FIG. 1, the memory core 100 is provided or implemented in a hierarchical bit-line structure that includes the global write bit-lines WGBL0 through WGBLn, the global read bit-lines RGBL0 through RGBLn, and the local bit-lines LBL0 through LBL8. In addition, the memory core 100 is implemented in a non-hierarchical word-line structure that includes the word-lines WL0 through WLm. However, the structure of the memory core 100 is not limited thereto. For example, the memory core 100 may be provided or implemented in a hierarchical word-line structure that includes main word-lines (i.e., global word-lines), and sub word-lines (i.e., local word-lines).

The discharge unit 130 may include a plurality of global write discharge transistors WDCH0 through WDCHn, and a plurality of global read discharge transistors RDCH0 through RDCHn. The discharge unit 130 may discharge the global write bit-lines WGBL0 through WGBLn, or the global read bit-lines RGBL0 through RGBLn. Further, the discharge unit 130 may discharge the local bit-lines LBL0 through LBLn coupled to the global write bit-lines WGBL0 through WGBLn, or the global read bit-lines RGBL0 through RGBLn.

In an active mode of the non-volatile semiconductor memory device, the non-volatile semiconductor memory device may discharge the global bit-lines (i.e., the global write bit-lines WGBL0 through WGBLn, or the global read bit-lines RGBL0 through RGBLn), and the local bit-lines LBL0 through LBLn by turning on the global write discharge transistors WDCH0 through WDCHn, or the global read discharge transistors RDCH0 through RDCHn in the discharge unit 130 before performing the read operation, or the write operation.

In a deep power-down mode and/or a stand-by mode of the non-volatile semiconductor memory device, the non-volatile semiconductor memory device may maintain the global write bit-lines WGBL0 through WGBLn, and the global read bit-lines RGBL0 through RGBLn in a floating state. The floating state may be maintained by turning off the global write discharge transistors WDCH0 through WDCHn, and the global read discharge transistors RDCH0 through RDCHn in the discharge unit 130.

Generally, if the global write bit-lines WGBL0 through WGBLn and/or the global read bit-lines RGBL0 through RGBLn have somewhat similar or substantially the same voltage as the word-lines WL0 through WLn, reverse currents flowing through the access elements AC of the phase change memory cells MC in the deep power-down mode and/or the stand-by mode of the non-volatile semiconductor memory device may be limited, prevented or reduced. Thus, by controlling the discharge unit 130, the non-volatile semiconductor memory device may limit or reduce power consumption due to the reverse currents flowing through the access elements AC of the phase change memory cells MC in the deep power-down mode and/or the stand-by mode of the non-volatile semiconductor memory device. The row decoder 140 may select one of the word-lines WL0 through WLm. The local column decoder 150 may select one of the local bit-lines LBL0_0 through LBL0_8 by controlling the local column selection unit 120. As a result of the selections by the row decoder 140 and the local column decoder 150, one of the phase change memory cells MC may be selected.

As described above, the non-volatile semiconductor memory device including the memory core 100 may limit or reduce power consumption due to stand-by current and/or deep power-down current flowing through the access elements AC of the phase change memory cells MC in the stand-by mode and/or the deep power-down mode of the non-volatile semiconductor memory device. In FIG. 1, the stand-by current indicates the reverse current flowing through the access elements AC in the stand-by mode of the non-volatile semiconductor memory device, and the deep power-down current indicates the reverse current flowing through the access elements AC in the deep power-down mode of the non-volatile semiconductor memory device. In addition, the non-volatile semiconductor memory device may achieve higher operation reliability and a higher operation stability by reducing, limiting or preventing a coupling phenomenon between a develop operation of the global read bit-lines RGBL0 through RGBLn coupled to the local bit-lines LBL0 through LBL8 for the read operation and a discharge operation of the global write bit-lines WGBL0 through WGBLn coupled to the local bit-lines LBL0 through LBL8 for the write operation if the non-volatile semiconductor memory device performs the read-while-write operation. Hereinafter, a method of discharging bit-lines for the non-volatile semiconductor memory device will be described in detail.

Figure 2:
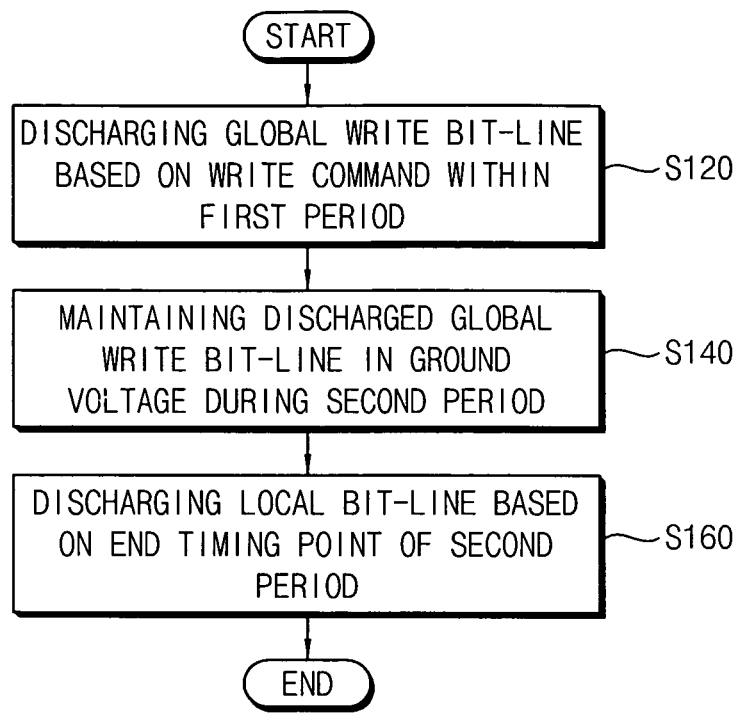
FIG. 2 is a flow chart illustrating a method of discharging bit-lines for a non-volatile semiconductor memory device according to example embodiments.

FIG. 2 is a flow chart illustrating a method of discharging bit-lines for a non-volatile semiconductor memory device according to some example embodiments.

Referring to FIG. 2, in the method of discharging bit-lines for a non-volatile semiconductor memory device, a global write bit-line may be discharged based on a write command within a first region to change a voltage of the global write bit-line into a ground voltage (Step S120). Then, the discharged global write bit-line may be maintained in the ground voltage during a second region (Step S140). In addition, a local bit-line may be discharged based on an end timing point of the second period to change a voltage of the local bit-line into the ground voltage (Step S160).

In an exemplary embodiment, both of the global write bit-line and the local bit-line may be maintained in a floating state before the write command is inputted into the non-volatile semiconductor memory device in a stand-by mode. If the write command is inputted into the non-volatile semiconductor memory device in the stand-by mode, the global write bit-line is discharged based on the write command within the first region (Step S120). The global write bit-line is discharged so that the voltage of the global write bit-line is changed into the ground voltage. Generally, the non-volatile semiconductor memory device (e.g., the PRAM device) performs a program operation based on a program command, and performs an erase operation based on an erase command. In this example embodiment, the write command for the write operation may correspond to one of the program command for the program operation and the erase command for the erase operation. That is, the non-volatile semiconductor memory device performs the write operation based on the write command.

The write command includes a plurality of command cycles (e.g., 6 command cycles). In addition, the command cycles are performed in sequence. Thus, the write operation is performed based on the write command in the command cycles. That is, the program operation is performed based on the program command in the command cycles, and the erase operation is performed based on the erase command in the command cycles. In an exemplary embodiment, the first period may be defined by an end timing point of the write command (i.e., all command cycles are performed) to a start timing point of an initial read operation. In an exemplary embodiment, the first period may be defined by an end timing point of a certain command cycle in the write command to the start timing point of the initial read operation. Nevertheless, a setting of the first period is not limited thereto. For example, it is assumed that the write command includes a plurality, such as 6 command cycles. In this example embodiment, the first period may be set to be from the end timing point of a sixth command cycle (i.e., all command cycles are performed) in the write command and to form the start timing point of the initial read operation. Alternatively, the first period may be defined by the end timing point of a fifth command cycle (i.e., the certain command cycle) in the write command to the start timing point of the initial read operation.

After the global write bit-line is discharged based on the write command within the first period to change the voltage of the global write bit-line into the ground voltage (Step S120), the discharged global write bit-line voltage is maintained in the ground voltage during the second period (Step S140). In an exemplary embodiment, the second period may be defined by an end timing point of a discharge operation of the global write bit-line to a start timing point of an initial write pulse. Nevertheless, a setting of the second period is not limited thereto. For example, the second period may be defined by from the end timing point of the discharge operation of the global write bit-line to a vicinity of the start timing point of the initial write pulse.

The local bit-line is discharged based on the end timing point of the second period (Step S160), so that the voltage of the local bit-line is changed into the ground voltage. Thus, the write operation may be prepared. In an exemplary embodiment, the local bit-line may be maintained in the floating state before the local bit-line is discharged based on the end timing point of the second period (Step S160). As described above, the second period may be defined by the end timing point of the discharge operation of the global write bit-line to the start timing point of the initial write pulse. Here, since the local bit-line is coupled to the global write bit-line, the local bit-line may be discharged based on the end timing point of the second period by a discharge unit coupled to the global write bit-line.

As a result, the non-volatile semiconductor memory device may achieve higher operation reliability and higher operation stability by limiting, reducing or preventing a coupling phenomenon between a develop operation of the global read bit-line coupled to the local bit-line for the read operation and a discharge operation of the global write bit-line coupled to the local bit-line for the write operation if the non-volatile semiconductor memory device performs a read-while-write operation.

Figure 3:
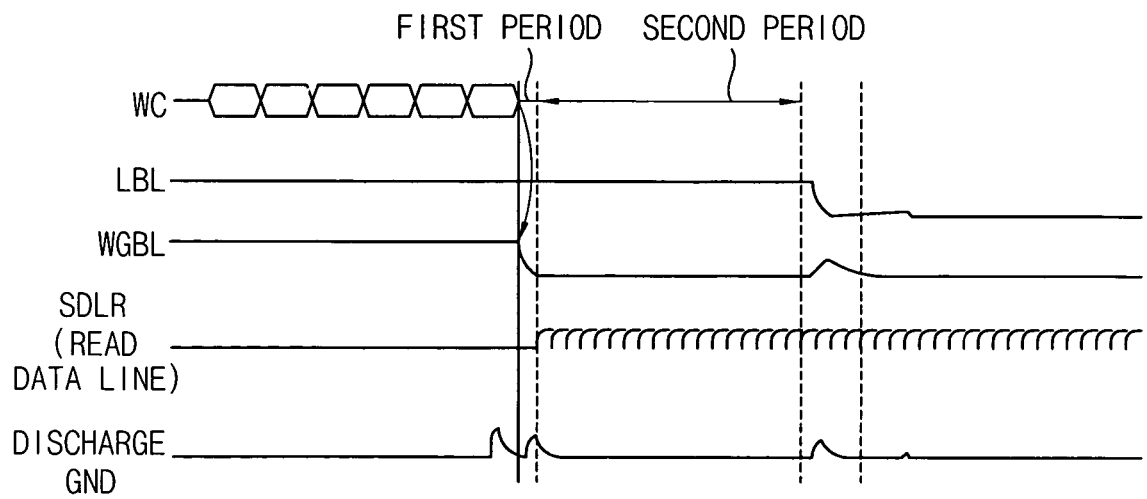
FIG. 3 is a timing diagram illustrating one example embodiment in which bit-lines are discharged by a method of FIG. 2.

FIG. 3 is a timing diagram illustrating one example embodiment in which bit-lines are discharged by a method of FIG. 2.

Referring to FIG. 3, the global write bit-line WGBL is discharged based on the write command WC within the first period if the write command WC is inputted into the non-volatile semiconductor memory device in the stand-by mode. Thus, the voltage of the global write bit-line WGBL is changed to the ground voltage GND within the first period. In an exemplary embodiment, both of the global write bit-line WGBL and the local bit-line LBL may be maintained in the floating state before the global write bit-line is discharged within the first period. As illustrated in FIG. 3, the write command WC includes 6 command cycles that are performed in sequence. The first period is defined by the end timing point of the write command WC (i.e., all 6 command cycles are performed) and the start timing point of the initial read operation. For example, the discharge operation of the global write bit-line WGBL may be started based on the end timing point of the sixth command cycle (i.e., all 6 command cycles are performed) in the write command WC. Then, the discharge operation of the global write bit-line WGBL may be finished before the initial read operation is performed. Since the process of the discharge operation in FIG. 3 is an exemplary embodiment, the process of the discharge operation is not limited thereto.

Once the global write bit-line WGBL is discharged based on the write command WC within the first period, the discharged global write bit-line WGBL is maintained in the ground voltage GND during the second period. As illustrated in FIG. 3, the second period is defined by the end timing point of the discharge operation of the global write bit-line WGBL and the start timing point of the initial write pulse. Then, the local bit-line LBL is discharged based on the end timing point of the second period, so that the voltage of the local bit-line LBL may be changed into the ground voltage GND. Thus, the write operation is prepared. In an exemplary embodiment, the local bit-line LBL may be maintained in the floating state before the local bit-line LBL is discharged based on the end timing point of the second period. Thus, in the non-volatile semiconductor memory device, the coupling phenomenon between the develop operation of the global read bit-line RGBL coupled to the local bit-line LBL for the read operation and the discharge operation of the global write bit-line WGBL coupled to the local bit-line LBL for the write operation may be limited, reduced or prevented if the non-volatile semiconductor memory device performs the read-while-write operation.

Figure 4:
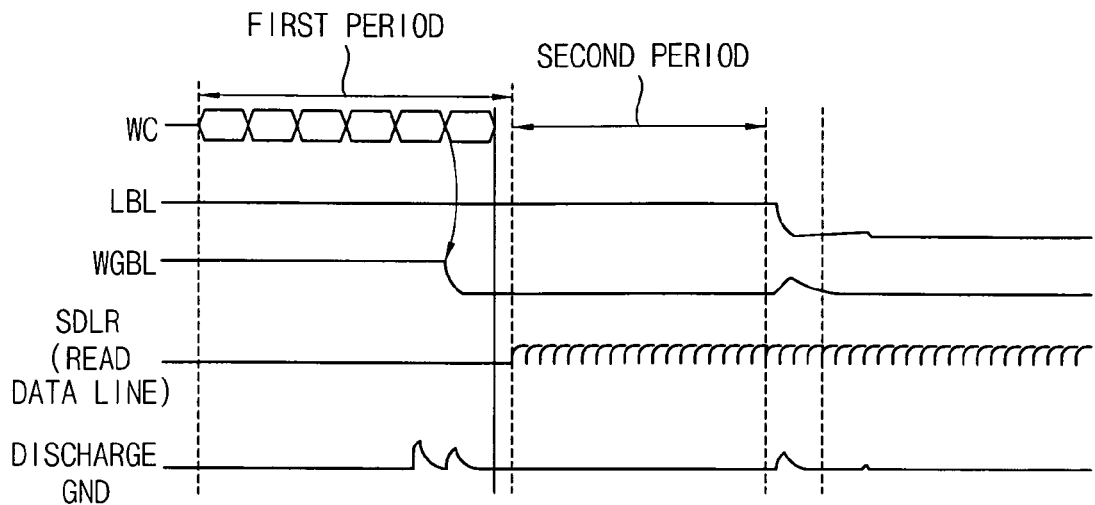
FIG. 4 is a timing diagram illustrating another example embodiment in which bit-lines are discharged by a method of FIG. 2.

FIG. 4 is a timing diagram illustrating another example case in which bit-lines are discharged by a method of FIG. 2.

Referring to FIG. 4, the global write bit-line WGBL is discharged based on the write command WC within the first period. The global write bit-line is discharged if the write command WC is inputted into the non-volatile semiconductor memory device in the stand-by mode. Thus, the voltage of the global write bit-line WGBL is changed to the ground voltage GND within the first period. As illustrated in FIG. 4, the write command WC includes 6 command cycles that are performed in sequence. The first period is defined by the first write command WC to the start timing point of the initial read operation. In an exemplary embodiment, before the global write bit-line WGBL is discharged based on a command cycle in the write command WC within the first period, both of the global write bit-line WGBL and the local bit-line LBL may be maintained in the floating state. As illustrated in FIG. 4, the write command WC includes 6 command cycles that are performed in sequence. The first period is defined by the end timing point of the certain command cycle in the write command WC to the start timing point of the initial read operation. For example, the discharge operation of the global write bit-line WGBL may be started based on the end timing point of the fifth command cycle (i.e., the certain command cycle). Then, the discharge operation of the global write bit-line WGBL may be finished before the initial read operation is performed. Since the process of the discharge operation in FIG. 4 is an exemplary embodiment, the process of the discharge operation is not limited thereto.

After the global write bit-line WGBL is discharged based on the write command WC within the first period, the discharged global write bit-line WGBL is maintained in the ground voltage GND during the second period. As illustrated in FIG. 4, the second period is defined by the end timing point of the discharge operation of the global write bit-line WGBL to the start timing point of the initial write pulse. Then, the local bit-line LBL is discharged based on the end timing point of the second period, so that the voltage of the local bit-line LBL is changed into the ground voltage GND. Thus, the write operation is prepared. In an exemplary embodiment, the local bit-line LBL may be maintained in the floating state before the local bit-line LBL is discharged based on the end timing point of the second period. Thus, in the non-volatile semiconductor memory device, the coupling phenomenon between the develop operation of the global read bit-line RGBL coupled to the local bit-line LBL for the read operation and the discharge operation of the global write bit-line WGBL coupled to the local bit-line LBL for the write operation may be limited, reduced or prevented if the non-volatile semiconductor memory device performs the read-while-write operation.

Figure 5:
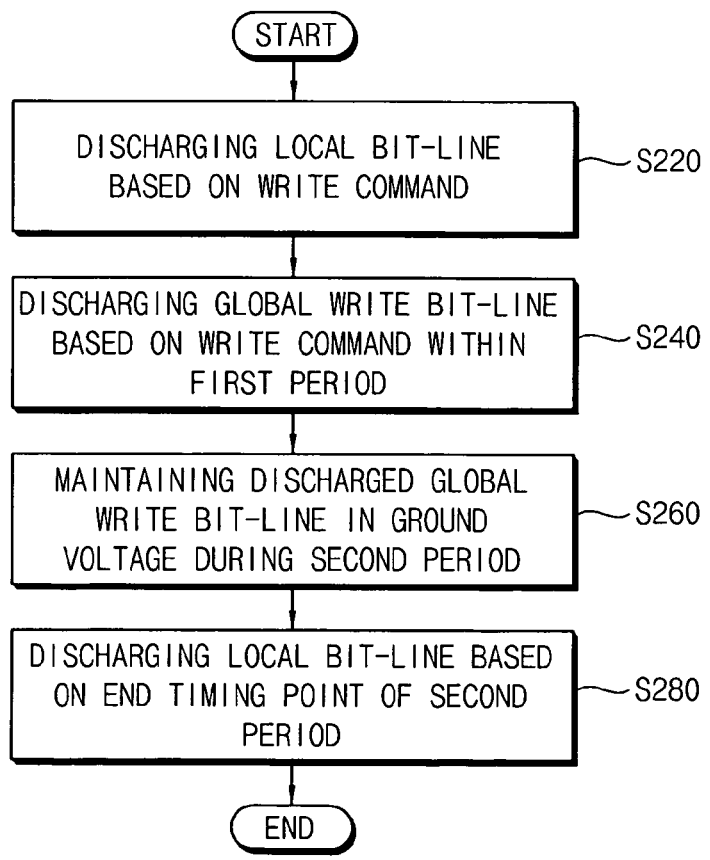
FIG. 5 is a flow chart illustrating a method of discharging bit-lines for a non-volatile semiconductor memory device according to example embodiments.

FIG. 5 is a flow chart illustrating a method of discharging bit-lines for a non-volatile semiconductor memory device according to some example embodiments.

Referring to FIG. 5, in the method of discharging bit-lines for a non-volatile semiconductor memory device, a local bit-line may be discharged based on a write command to change a voltage of the local bit-line into a ground voltage (Step S220). After the local bit-line is discharged based on the write command, a global write bit-line may be discharged based on the write command within a first region to change a voltage of the global write bit-line into the ground voltage (Step S240). Then, the discharged global write bit-line may be maintained in the ground voltage during a second region (Step S260). In addition, the local bit-line may be discharged based on an end timing point of the second period to change the voltage of the local bit-line into the ground voltage (Step S280).

In an exemplary embodiment, both of the global write bit-line and the local bit-line are maintained in a floating state before the write command is inputted into the non-volatile semiconductor memory device in a stand-by mode. If the write command is inputted into the non-volatile semiconductor memory device in the stand-by mode, the local bit-line is discharged based on the write command (Step S220). Thus, the voltage of the local bit-line is changed into the ground voltage. After the local bit-line is discharged into the ground voltage based on the write command, the global write bit-line is discharged based on the write command within the first region (Step S240). Thus the voltage of the global write bit-line is changed into the ground voltage. Generally, the non-volatile semiconductor memory device (e.g., the PRAM device) performs a program operation based on a program command, and performs an erase operation based on an erase command. Here, the write command for the write operation may correspond to one of the program command for the program operation and the erase command for the erase operation. That is, the non-volatile semiconductor memory device performs the write operation based on the write command.

In FIG. 5, the local bit-line may be discharged based on the write command (Step S220), changing the voltage of the local bit-line to the ground voltage. As a result, a discharge load for a discharge unit to discharge the local bit-line may be limited or reduced if the local bit-line is discharged based on the end timing point of the second period (Step S280). That is, the local bit-line is scheduled to be discharged twice (i.e., Step S220 and Step S280). In an exemplary embodiment, the local bit-line may be discharged based on the write command (Step S220) if the local bit-line is coupled to a global read bit-line coupled to the discharge unit. Thus, Step S220 may not influence the global write bit-line.

The write command includes a plurality of command cycles (e.g., 6 command cycles). In addition, the command cycles are performed in sequence. Thus, the write operation is performed based on the command cycles in the write command. In an exemplary embodiment, the first period may be defined by an end timing point of the write command (i.e., all command cycles are performed) to a start timing point of an initial read operation. In an exemplary embodiment, the first period may defined by an end timing point of a certain command cycle in the write command to the start timing point of the initial read operation. Nevertheless, a setting of the first period is not limited thereto. For example, it may be assumed that the write command includes 6 command cycles. In this example embodiment, the first period may be set to be from the end timing point of a sixth command cycle (i.e., all command cycles are performed) in the write command to the start timing point of the initial read operation, or may be set to be from the end timing point of a fifth command cycle (i.e., the certain command cycle) in the write command to the start timing point of the initial read operation.

After the global write bit-line is discharged based on the write command within the first period to change the voltage of the global write bit-line to the ground voltage (Step S240), the discharged global write bit-line is maintained in the ground voltage during the second period (Step S260). In an exemplary embodiment, the second period may be defined by an end timing point of a discharge operation of the global write bit-line to a start timing point of an initial write pulse. Nevertheless, a setting of the second period is not limited thereto. For example, the second period may be defined by the end timing point of the discharge operation of the global write bit-line to a vicinity of the start timing point of the initial write pulse.

Then, the local bit-line is discharged based on the end timing point of the second period (Step S280), so that the voltage of the local bit-line is changed to the ground voltage. Thus, the write operation may be prepared in step S280. In an exemplary embodiment, the local bit-line may be maintained in the floating state before the local bit-line is discharged based on the end timing point of the second period (Step S280) after the local bit-line is discharged based on the write command (Step S220). As described above, the second period may be defined by the end timing point of the discharge operation of the global write bit-line to the start timing point of the initial write pulse. Here, since the local bit-line is coupled to the global read bit-line and the global write bit-line, the local bit-line may be discharged twice (Step S220 and Step S280) by the discharge unit coupled to the global read bit-line and the global write bit-line.

As a result, the non-volatile semiconductor memory device may achieve higher operation reliability and higher operation stability by limiting, reducing or preventing a coupling phenomenon between a develop operation of the global read bit-line coupled to the local bit-line for the read operation and a discharge operation of the global write bit-line coupled to the local bit-line for the write operation if the non-volatile semiconductor memory device performs a read-while-write operation.

Figure 6:
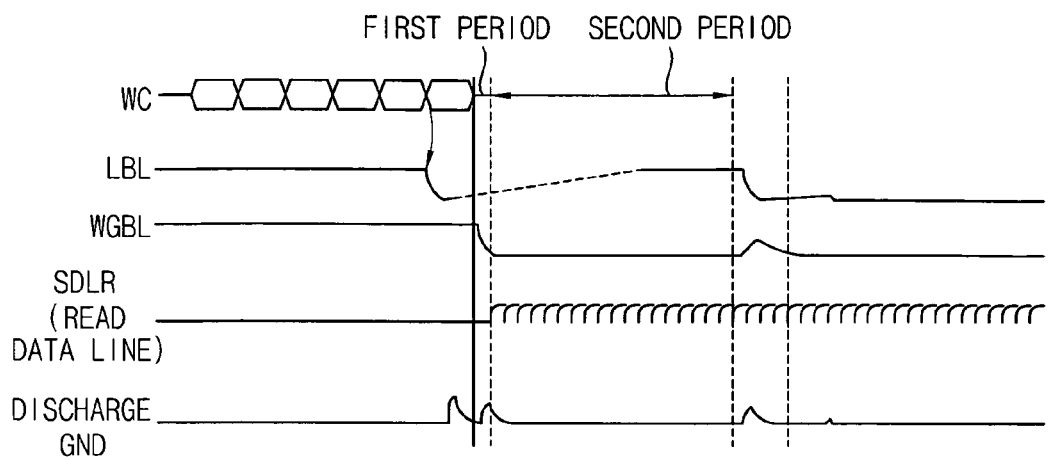
FIG. 6 is a timing diagram illustrating one example embodiment in which bit-lines are discharged by a method of FIG. 5.

FIG. 6 is a timing diagram illustrating one example case in which bit-lines are discharged by a method of FIG. 5.

Referring to FIG. 6, the local bit-line LBL is discharged based on the write command WC if the write command WC is inputted into the non-volatile semiconductor memory device in the stand-by mode. Thus, the voltage of the local bit-line LBL is changed into the ground voltage GND. After the local bit-line LBL is discharged based on the write command WC, the global write bit-line WGBL is discharged based on the write command WC within the first period. Thus, the voltage of the global write bit-line WGBL is changed to the ground voltage GND within the first period. In an exemplary embodiment, both of the local bit-line LBL and the global write bit-line WGBL may be maintained in the floating state before the global write bit-line WGBL is discharged within the first period. As illustrated in FIG. 6, the write command WC includes 6 command cycles that are performed in sequence. The first period is defined by the end timing point of the write command WC (i.e., all 6 command cycles are performed) to the start timing point of the initial read operation. For example, the discharge operation of the local bit-line LBL may be started based on the end timing point of the fifth command cycle (i.e., the certain command cycle) in the write command WC. In addition, the discharge operation of the global write bit-line WGBL may be started based on the end timing point of the sixth command cycle (i.e., all 6 command cycles are performed) in the write command WC. Then, the discharge operation of the global write bit-line WGBL may be finished before the initial read operation is performed. Since the process of the discharge operation in FIG. 6 is an exemplary embodiment, the process of the discharge operation is not limited thereto.

After the global write bit-line WGBL is discharged based on the write command WC within the first period, the discharged global write bit-line WGBL is maintained in the ground voltage GND during the second period. As illustrated in FIG. 6, the second period is defined by the end timing point of the discharge operation of the global write bit-line WGBL to the start timing point of the initial write pulse. Then, the local bit-line LBL is discharged based on the end timing point of the second period, so that the voltage of the local bit-line LBL may be changed to the ground voltage GND. Thus, the write operation is prepared. As described above, a discharge load for a discharge unit to discharge the local bit-line LBL may be limited or reduced because the local bit-line LBL is discharged twice. In an exemplary embodiment, the local bit-line LBL may be maintained in the floating state before the local bit-line LBL is discharged based on the end timing point of the second period. Thus, in the non-volatile semiconductor memory device, the coupling phenomenon between the develop operation of the global read bit-line RGBL coupled to the local bit-line LBL for the read operation and the discharge operation of the global write bit-line WGBL coupled to the local bit-line LBL for the write operation may be reduced, limited or prevented if the non-volatile semiconductor memory device performs the read-while-write operation.

Figure 7:
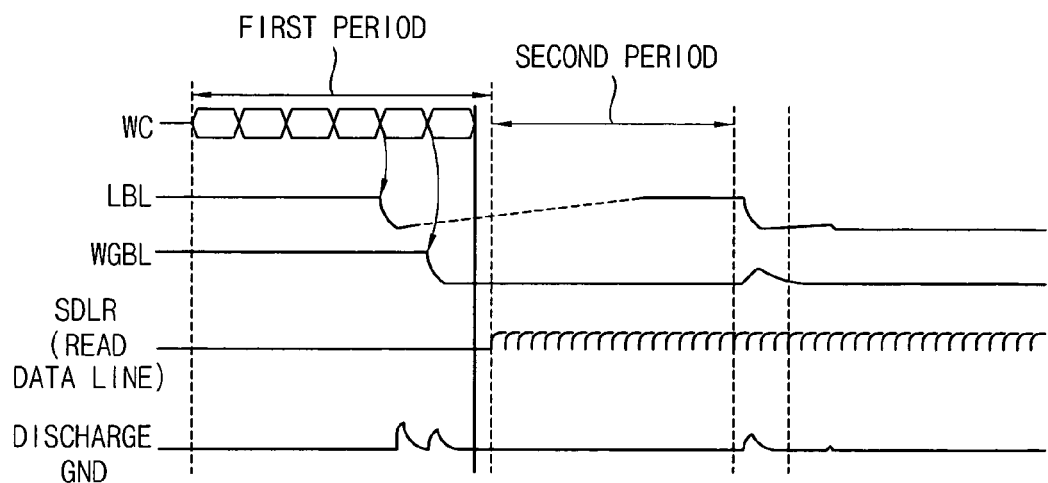
FIG. 7 is a timing diagram illustrating another example embodiment in which bit-lines are discharged by a method of FIG. 5.

FIG. 7 is a timing diagram illustrating another example embodiment in which bit-lines are discharged by a method of FIG. 5.

Referring to FIG. 7, the local bit-line LBL is discharged based on the write command WC if the write command WC is inputted into the non-volatile semiconductor memory device in the stand-by mode. Thus, the voltage of the local bit-line LBL is changed into the ground voltage GND. After the local bit-line LBL is discharged based on the write command WC, the global write bit-line WGBL is discharged based on the write command WC. Thus, the voltage of the global write bit-line WGBL is changed into the ground voltage GND within the first period. In an exemplary embodiment, both of the local bit-line LBL and the global write bit-line WGBL may be maintained in the floating state before the global write bit-line WGBL is discharged within the first period. As illustrated in FIG. 7, the write command WC includes 6 command cycles that are performed in sequence. The first period is defined by the end timing point of the certain command cycle in the write command WC to the start timing point of the initial read operation. For example, the discharge operation of the local bit-line LBL may be started based on the end timing point of the fourth command cycle (i.e., the certain command cycle) in the write command WC. In addition, the discharge operation of the global write bit-line WGBL may be started based on the end timing point of the fifth command cycle (i.e., the certain command cycle) in the write command WC. Then, the discharge operation of the global write bit-line WGBL may be finished before the initial read operation is performed. Since the process of the discharge operation in FIG. 7 is an exemplary embodiment, the process of the discharge operation is not limited thereto.

After the global write bit-line WGBL is discharged based on the write command WC within the first-period, the discharged global write bit-line WGBL is maintained in the ground voltage GND during the second period. As illustrated in FIG. 7, the second period is defined by the end timing point of the discharge operation of the global write bit-line WGBL to the start timing point of the initial write pulse. Then, the local bit-line LBL is discharged based on the end timing point of the second period, so that the voltage of the local bit-line LBL may be changed into the ground voltage GND. Thus, the write operation is prepared. As described above, a discharge load for a discharge unit to discharge the local bit-line LBL may be limited, prevented or reduced because the local bit-line LBL is discharged twice. In an exemplary embodiment, the local bit-line LBL may be maintained in the floating state before the local bit-line LBL is discharged based on the end timing point of the second period. Thus, in the non-volatile semiconductor memory device, the coupling phenomenon between the develop operation of the global read bit-line RGBL coupled to the local bit-line LBL for the read operation and the discharge operation of the global write bit-line WGBL coupled to the local bit-line LBL for the write operation may be limited, reduced or prevented if the non-volatile semiconductor memory device performs the read-while-write operation.

Figure 8:
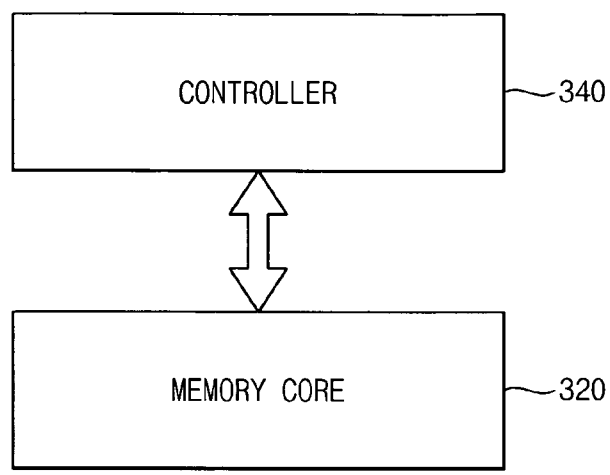
FIG. 8 is a block diagram illustrating a non-volatile semiconductor memory device according to example embodiments.

FIG. 8 is a block diagram illustrating a non-volatile semiconductor memory device according to some example embodiments.

Referring to FIG. 8, the non-volatile semiconductor memory device 300 may include a memory core 320 and a controller 340. The memory core 320 may include a memory cell array (not illustrated) and a plurality of peripheral circuits (not illustrated). The controller 340 may control operations of the memory core 320. The method of discharging bit-lines in the non-volatile semiconductor memory device 300 according to some example embodiments will be omitted because the method of discharging bit-lines in the non-volatile semiconductor memory device 300 according to some example embodiments is described above. As described above, the non-volatile semiconductor memory device 300 may limit, reduce or prevent a coupling phenomenon between a develop operation of global read bit-lines coupled to local bit-lines for a read operation and a discharge operation of global write bit-lines coupled to local bit-lines for a write operation if the non-volatile semiconductor memory device 300 performs a read-while-write operation. As a result, the non-volatile semiconductor memory device 300 may achieve higher operation reliability and higher operation stability.

Figure 9:
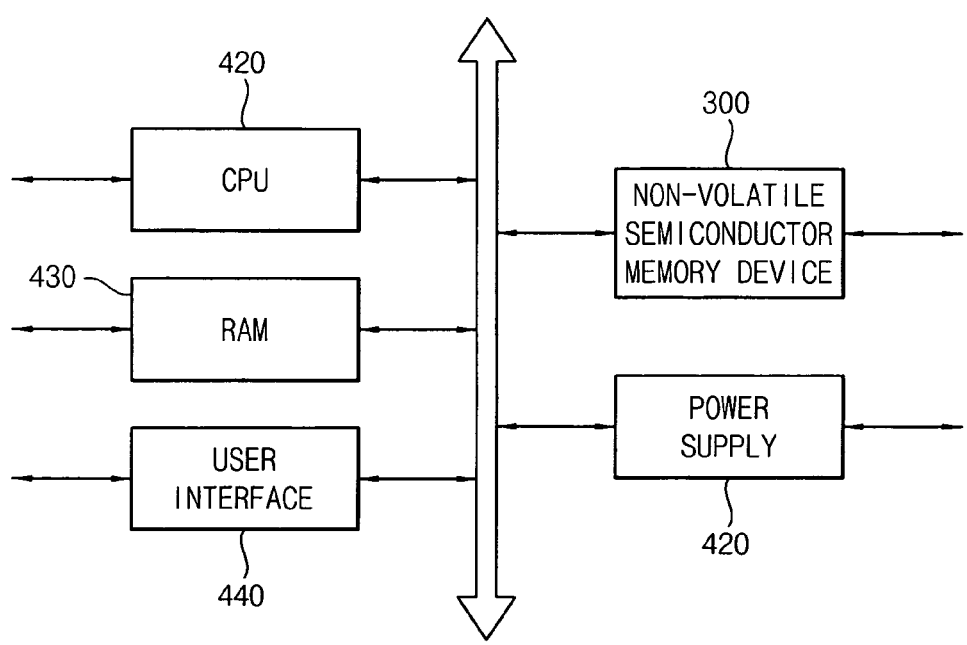
FIG. 9 is a block diagram illustrating an electric device including a non-volatile semiconductor memory device of FIG. 8.

FIG. 9 is a block diagram illustrating an electric device including a non-volatile semiconductor memory device of FIG. 8.

Referring to FIG. 9, the electric device 400 may include the non-volatile semiconductor memory device 300, a central processing unit (CPU) 420, a random access memory (RAM) 430, a user interface 440, and a power supply 450. Further, the non-volatile semiconductor memory device 300 may include a memory core 320 and a controller 340, as shown in FIG. 8.

The non-volatile semiconductor memory device 300 may limit, reduce or prevent the coupling phenomenon between the develop operation of the global read bit-lines coupled to the local bit-lines for the read operation and the discharge operation of the global write bit-lines coupled to the local bit-lines for the write operation if the non-volatile semiconductor memory device 300 performs the read-while-write operation. As illustrated in FIG. 9, in the electric device 400, the non-volatile semiconductor memory device 300 may be coupled to the CPU 420, the RAM 430, the user interface 440, and the power supply 450 via a bus. Thus, the non-volatile semiconductor memory device 300, the CPU 420, the RAM 430, the user interface 440, and the power supply 450 may interact with each other. The electric device 400 can achieve higher operation reliability and higher operation stability because the electric device 400 includes the non-volatile semiconductor memory device 300.

As described above, in the method of discharging bit-lines in the non-volatile semiconductor memory device according to some example embodiments, the coupling phenomenon between the develop operation of the global read bit-lines coupled to the local bit-lines for the read operation and the discharge operation of the global write bit-lines coupled to the local bit-lines for the write operation may be limited, reduced or prevented if the non-volatile semiconductor memory device performs the read-while-write operation. As a result, the non-volatile semiconductor memory device can achieve higher operation reliability and higher operation stability. Therefore, the present inventive concepts may be applied to the non-volatile semiconductor memory device such as a phase change random access memory (PRAM) device, a flash memory device, a magnetic random access memory (MRAM) device, a resistive random access memory (RRAM) device, etc. Further, the non-volatile semiconductor memory device may be applied to an electric device such as a MP3 player, a cellular phone, a personal digital assistant (PDA), a portable multimedia player (PMP), a digital camera, a laptop, a computer, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of discharging bit-lines for a non-volatile semiconductor memory device performing a read-while-write operation, comprising:

maintaining a global write bit-line in a floating state before receiving a write command in the non-volatile semiconductor memory device in a stand-by mode;

discharging a voltage of the global write bit-line to a ground voltage based on the write command within a first period;

maintaining the discharged voltage of the global write bit-line at the ground voltage during a second period; and discharging a voltage of a local bit-line to the ground voltage based on an ending point of the second period.

2. The method of claim 1, further comprising:

maintaining the local bit-line in a floating state before receiving the write command in the non-volatile semiconductor memory device in the stand-by mode.

3. The method of claim 1, further comprising:

maintaining the local bit-line in a floating state—before the discharging the voltage of the local bit-line.

4. The method of claim 1, further comprising:

discharging the voltage of the local bit-line to the ground voltage based on the write command within the first period before the discharging the voltage of the global write bit-line.

5. The method of claim 4, further comprising:

maintaining the local bit-line in a floating state between the discharging the voltage of the local bit-line based on the write command and the discharging the voltage of the local bit-line based on the ending-point of the second period.

6. The method of claim 1, wherein the non-volatile semiconductor memory device is one of a phase change random access memory device, a resistive random access memory device, a magnetic random access memory device and a ferroelectric random access memory.

7. The method of claim 6, wherein the write command corresponds to one of a program command for a program operation and an erase command for an erase operation.

8. The method of claim 7, wherein the write command includes a plurality of command cycles that are performed in sequence.

9. The method of claim 8, wherein the program operation is performed based on the program command within the command cycles.

10. The method of claim 8, wherein the erase operation is performed based on the erase command in the command cycles.

11. The method of claim 8, wherein the first period is defined by an ending point of the write command to a starting point of an initial read operation.

12. The method of claim 11, wherein the second period is defined by an ending point of a discharge operation of the global write bit-line to a starting point of an initial write pulse.

13. The method of claim 8, wherein the first period is defined by an ending point of an individual write command in the command cycle to a starting point of an initial read operation.

14. The method of claim 13, wherein the second period is defined by an ending point of a discharge operation of the global write bit-line to a starting point of an initial write pulse.

15. A method of discharging a bit-line for a semiconductor memory device, comprising:

maintaining a global write bit-line and a local bit-line in a floating state before receiving a write command in the semiconductor memory device;

discharging a voltage of the global write bit-line in a first period;

discharging a voltage of the local bit-line at the end of a second period; and maintaining the discharged voltage of the global write bit-line during the second period.

16. The method of claim 15, wherein the discharging the voltage of the global write bit-line is based on the write command.

17. The method of claim 15, wherein the first period is defined by an ending point of the write command to a start of an initial read operation, and the second period defined by an end of a discharge operation of the global write bit-line to a start of an initial write pulse.

* * * * *